United States Patent
Chen et al.

(10) Patent No.: US 8,912,819 B2
(45) Date of Patent: Dec. 16, 2014

(54) TERMINATION CIRCUITS CAPABLE OF RECEIVING DATA SIGNALS IN DIFFERENT FORMATS FOR PERFORMING IMPEDANCE MATCHING

(71) Applicant: MediaTek Inc., Hsin-Chu (TW)

(72) Inventors: Qui-Ting Chen, New Taipei (TW); Huai-Te Wang, Bade (TW)

(73) Assignee: MediaTek Inc., Hsin-Chu (TW)

( * ) Notice: Subject to any disclaimer, the term of this patent is extended or adjusted under 35 U.S.C. 154(b) by 120 days.

(21) Appl. No.: 13/846,105

(22) Filed: Mar. 18, 2013

(65) Prior Publication Data
US 2014/0266298 A1   Sep. 18, 2014

(51) Int. Cl.
H03K 19/003   (2006.01)
H03K 19/00   (2006.01)

(52) U.S. Cl.
CPC ................................. H03K 19/0005 (2013.01)
USPC .......................................................... 326/30

(58) Field of Classification Search
USPC ............................................... 326/21–28, 30
See application file for complete search history.

(56) References Cited

U.S. PATENT DOCUMENTS

| | | | | |
|---|---|---|---|---|
| 6,154,047 | A * | 11/2000 | Taguchi | 326/30 |
| 6,838,900 | B2 * | 1/2005 | Huang et al. | 326/30 |
| 6,924,659 | B1 * | 8/2005 | Andrews et al. | 326/30 |
| 7,859,298 | B1 * | 12/2010 | Swartz et al. | 326/30 |
| 8,072,235 | B2 * | 12/2011 | Nguyen | 326/30 |
| 8,289,046 | B2 * | 10/2012 | Aziz et al. | 326/30 |
| 2005/0225353 | A1 * | 10/2005 | Kwon | 326/30 |
| 2007/0103186 | A1 * | 5/2007 | Clements et al. | 326/30 |
| 2014/0139261 | A1 * | 5/2014 | Nguyen | 326/30 |

* cited by examiner

*Primary Examiner* — Don Le
(74) *Attorney, Agent, or Firm* — McClure, Qualey & Rodack, LLP

(57) ABSTRACT

A termination circuit is provided. The termination circuit includes a first receiving terminal, a second receiving terminal, a first resistive device, a second resistive device, a third resistive device, a fourth resistive device and a first switch. The first receiving terminal receives a first data signal. The second receiving terminal receives a second data signal. The first resistive device is coupled between a supply voltage and the first receiving terminal. The second resistive device is coupled between the supply voltage and the second receiving terminal. The third resistive device is coupled between the first receiving terminal and a first node. The fourth resistive device is coupled between the second receiving terminal and the first node. The first switch is coupled between the supply voltage and the first node.

16 Claims, 7 Drawing Sheets

US 8,912,819 B2

TERMINATION CIRCUITS CAPABLE OF RECEIVING DATA SIGNALS IN DIFFERENT FORMATS FOR PERFORMING IMPEDANCE MATCHING

BACKGROUND OF THE INVENTION

1. Field of the Invention

The invention relates to a termination circuit, and more particularly to a termination circuit capable of receiving data signals in different formats for performing impedance matching.

2. Description of the Related Art

The distribution of television signals has increasingly become based on digital methods and digitally encoded forms of video and audio signals. At the same time, higher resolution (high definition TV) has become available in the market place, commensurate with larger and higher definition displays. To meet the requirement of interconnecting such high definition displays with digital signal sources such as Digital Versatile Disc (DVD) players and receivers/decoders for digital satellite and digital cable distribution of video material, a digital interface standard has evolved, known as the High-Definition Multimedia Interface (HDMI). This HDMI standard can be employed for connecting digital video sources to digital video sinks over a cable that carries a number of digital signals and a clock signal.

Besides HDMI, another high definition audio/video interface has also evolved, known as Mobile High-Definition Link (MHL). MHL is an industry standard for a mobile audio/video interface for directly connecting mobile phones and other portable consumer electronics (CE) devices to high-definition televisions (HDTVs) and displays. The MHL standard features a single cable with a low pin-count interface able to support up to 1080p high-definition (HD) video and digital audio while simultaneously charging the connected device.

In order to support both high definition interfaces of the HDMI and MHL on the same equipment, a termination circuit capable of receiving data signals in different formats for performing impedance matching is required.

BRIEF SUMMARY OF THE INVENTION

Termination circuits are provided. An exemplary embodiment of a termination circuit comprises a first receiving terminal, a second receiving terminal, a first resistive device, a second resistive device, a third resistive device, a fourth resistive device and a first switch. The first receiving terminal receives a first data signal. The second receiving terminal receives a second data signal. The first resistive device is coupled between a supply voltage and the first receiving terminal. The second resistive device is coupled between the supply voltage and the second receiving terminal. The third resistive device is coupled between the first receiving terminal and a first node. The fourth resistive device is coupled between the second receiving terminal and the first node. The first switch is coupled between the supply voltage and the first node.

Another exemplary embodiment of a termination circuit comprises a first receiving terminal, a second receiving terminal, a first resistive device, a second resistive device, a third resistive device and a fourth resistive device. The first receiving terminal receives a first data signal. The second receiving terminal receives a second data signal. The first resistive device is coupled between a supply voltage and the first receiving terminal. The second resistive device is coupled between the supply voltage and the second receiving terminal. When the first and second data signals are a pair of differential signals of a first format, the third resistive device is configured to be coupled between the supply voltage and the first receiving terminal, and the fourth resistive device is configured to be coupled between the supply voltage and the second receiving terminal, and when the first and second data signals are a pair of differential signals of a second format, the third resistive device and the fourth resistive device are configured to be coupled in series between the first receiving terminal and the second receiving terminal.

Another exemplary embodiment of a termination circuit comprises a first receiving terminal, a second receiving terminal, a first 60 ohm resistor, a second 60 ohm resistor, a first 300 ohm resistor, a second 300 ohm resistor and a switch. The first receiving terminal receives a first data signal. The second receiving terminal receives a second data signal. The first 60 ohm resistor is coupled between a supply voltage and the first receiving terminal. The second 60 ohm resistor is coupled between the supply voltage and the second receiving terminal. The first 300 ohm resistor, is coupled between the first receiving terminal and a first node. The second 300 ohm resistor is coupled between the second receiving terminal and the first node. The switch is coupled between the supply voltage and the first node. The switch is turned on when the first data signal and the second data signal are HDMI signals, and the switch is turned off when the first data signal and the second data signal are MHL signals.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
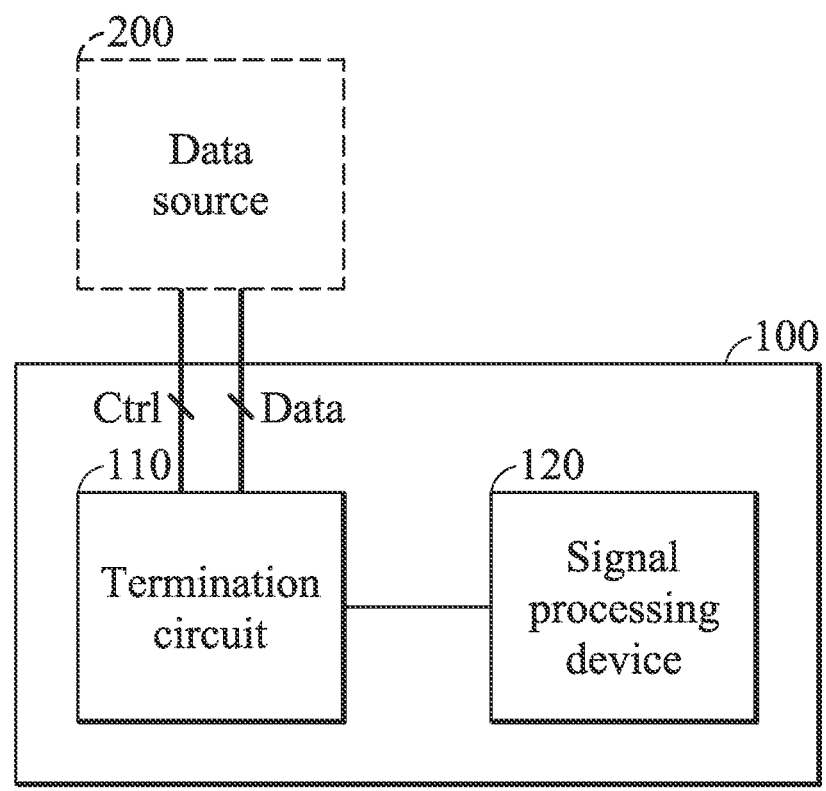
FIG. 1 is a simplified block diagram of an audio/video signal processing apparatus according to an embodiment of the invention.

FIG. 1 is a simplified block diagram of an audio/video signal processing apparatus according to an embodiment of the invention. The audio/video signal processing apparatus 100 may comprise a termination circuit 110 and a signal processing device 120. The termination circuit 110 may be operative to receive input data signals DATA comprising audio/video contents from an external data source 200 and perform impedance matching on the input data signals DATA for reducing the reflection loss on the input data signals DATA, thus keeping good signal quality. The signal processing device 120 is coupled to the termination circuit 110 for receiving the input data signals DATA after impedance matching. In some embodiments of the invention, the audio/video signal processing apparatus 100 may be a chip of a digital television, a cellular phone, a portable electronic device, a tablet, a gaming device, a receiver, or others.

According to an embodiment of the invention, in order to be capable of receiving and processing input data signals in different formats, the termination circuit 110 may comprise one or more switches which is/are turned on or off in response to corresponding control signal(s) Ctrl, such that an equivalent circuit of the termination circuit 110 may be dynamically changed based on the format of the input data signals. Several embodiments of the proposed termination circuit capable of receiving and processing input data signals in different formats will be introduced in the following paragraphs.

Note that FIG. 1 presents a simplified block diagram, in which some elements required by a common audio/video signal processing apparatus are omitted here for brevity. Therefore, the invention should not be limited thereto. Note further that, the label "Ctrl" in FIG. 1 represents one or more control signal(s) sent by the external data source 200. However, in some other embodiments of the invention, instead of receiving the control signal(s) from the external data source 200, the control signal(s) may also be generated or provided by the signal processing device 120 or an internal processor (not shown) of the audio/video signal processing apparatus 100. Therefore, the invention should not be limited thereto.

Figure 2:
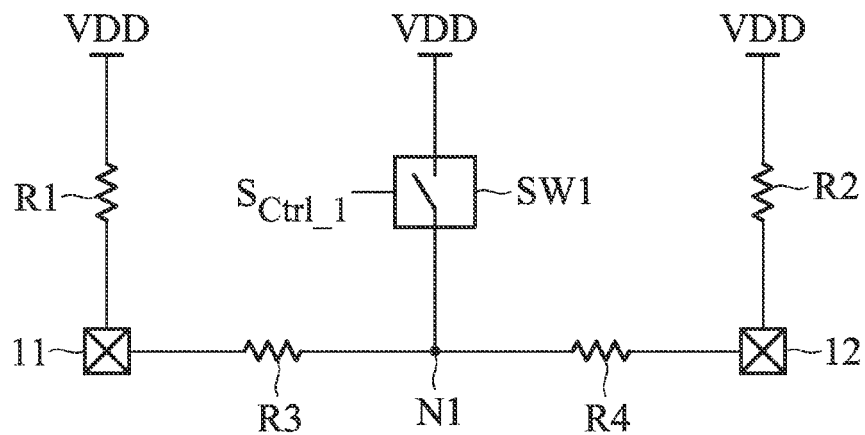
FIG. 2 shows an exemplary circuit diagram of a termination circuit according to a first embodiment of the invention.

FIG. 2 shows an exemplary circuit diagram of a termination circuit according to a first embodiment of the invention. The termination circuit 210 may comprise receiving terminals, which are implemented by pads 11 and 12 in this embodiment, resistive devices R1~R4 and at least one switch SW1. The pad 11 is operative to receive a first data signal and the pad 12 is operative to receive a second data signal. The first data signal and the second data signal usually form a pair of differential signals, but the invention is not limited thereto. The resistive device R1 is coupled between the supply voltage VDD and the pad 11. The resistive device R2 is coupled between the supply voltage VDD and the pad 12. The resistive device R3 is coupled between the pad 11 and a node N1. The resistive device R4 is coupled between the pad 12 and the node N1. The switch SW1 is coupled between the supply voltage VDD and the node N1.

When different types of connectors of the external data source 200 are connected to the audio/video signal processing apparatus 100, the data format of data signals received from the external data source 200 may vary accordingly. For example, when an HDMI connector of the external data source 200 is connected to the audio/video signal processing apparatus 100, the data signals received from the external data source 200 is in HDMI format. For another example, when an MHL connector of the external data source 200 is connected to the audio/video signal processing apparatus 100, the data signals received from the external data source 200 is in MHL format. A detailed specification for HDMI can be obtained from the "hdmi.org" website, which is incorporated herein by reference.

An equivalent circuit of the termination circuit 210 may be dynamically changed based on the format of the input data signals. According to an embodiment of the invention, when the first data signal and the second data signal are a pair of differential signals of a first format, for example, HDMI, the switch SW1 is turned on in response to a control signal $S_{Ctrl\_1}$, such that the node N1 is electrically connected to the supply voltage VDD. In this manner, the resistive devices R1 and R3 are coupled in parallel between the supply voltage VDD and the pad 11 to contribute a first impedance, and the resistive devices R2 and R4 are coupled in parallel between the supply voltage VDD and the pad 12 to contribute a second impedance. In a preferred embodiment of the invention, the resistance of the resistive devices R1~R4 may be well designed such that the first impedance is equal to the second impedance.

Figure 3:
FIG. 3 shows an equivalent termination circuit when the switch SW1 is turned on according to an embodiment of the invention.

FIG. 3 shows an equivalent termination circuit when the switch SW1 is turned on according to an embodiment of the invention. When the resistance of the first and second resistive devices R1 and R2 are designed to be the same, for example, 60Ω, and resistance of the resistive devices R3 and R4 are designed to be the same, for example, 300Ω, the equivalent termination circuit 310 may comprise two 50Ω resistors R respectively coupled between the supply voltage VDD and the pads 11 and 12.

Figure 4:
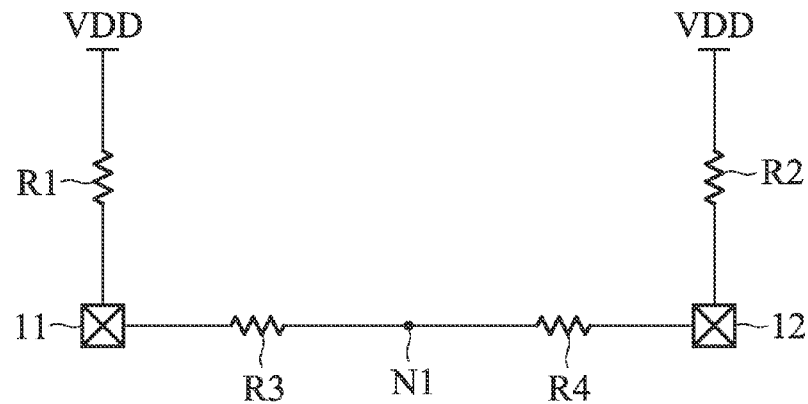
FIG. 4 shows another equivalent termination circuit when the switch SW1 is turned off according to another embodiment of the invention.

On the other hand, when the first data signal and the second data signal are a pair of differential signals of a second format, for example, MHL, the switch SW1 is turned off in response to the control signal $S_{Ctrl\_1}$, such that the node N1 is disconnected from the supply voltage VDD. FIG. 4 shows another equivalent termination circuit when the switch SW1 is turned off according to another embodiment of the invention. The equivalent termination circuit 410 may comprise the resistive device R1 coupled between the supply voltage VDD and the pad 11, the resistive device R2 coupled between the supply voltage VDD and the pad 12 and the resistive devices R3 and R4 are coupled in serial between the pads 11 and 12. The node N1 becomes a common mode node such that the common mode signal (for example, the clock signal) carried in the first and second data signals may be extracted therefrom.

Note that the control signal $S_{Ctrl\_1}$ (and further the control signal $S_{Ctrl\_0}$, $S_{Ctrl\_2}$, and/or $S_{Ctrl\_3}$, which will be introduced in the following embodiments) may be set to different levels by the external data source 200, the signal processing device 120 or an internal processor (not shown) of the audio/video signal processing apparatus 100 when the type of connector connected to the audio/video signal processing apparatus 100 is detected. Methods of detecting the connector types are well known in the art and are not further discussed here for brevity.

In some embodiments of the invention, the termination circuit 410 may further comprise a first additional switch coupled between the resistive device R1 and the supply voltage VDD and a second additional switch coupled between the resistive device R2 and the supply voltage VDD. The first and second additional switches may be generally turned on, and only turned off when required, for disconnecting the resistive devices R1 and R2 from the supply voltage VDD, and thereby the power consumption is saved. For example, when there is no other external data source providing data signal to the audio/video signal processing apparatus 100. In addition, in some embodiments of the invention, the switches as discussed above may also be replaced by a transistor, a BJT, or the likes.

Figure 5:
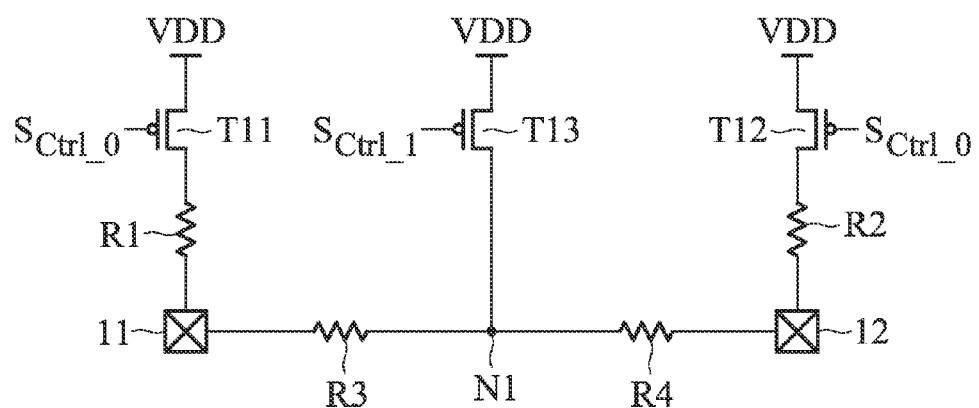
FIG. 5 shows another exemplary circuit diagram of a termination circuit according to the first embodiment of the invention.

FIG. 5 shows another exemplary circuit diagram of a termination circuit according to the first embodiment of the invention. The termination circuit 510 may comprise pads 11 and 12, resistive devices R1~R4 and transistors T11~T13. The transistors T11~T12 are turned on or off in response to another control signal $S_{Ctrl\_0}$, for selectively disconnecting the resistive devices R1 and R2 from the supply voltage VDD when required. For example, the transistors T11~T12 are turned off, causing the resistive devices R1 and R2 being disconnected from the supply voltage VDD, when the external data source 200 is removed and/or there is no other external data source providing data signals to the audio/video signal processing apparatus 100. The transistor T13 is turned on or off in response to the control signal $S_{Ctrl\_1}$ as discussed above, such that the resistive devices R3 and R4 are selectively connected to the supply voltage VDD. Therefore, an equivalent circuit of the termination circuit 510 may also be dynamically changed to the one shown in FIG. 3 or FIG. 4 based on the format of the input data signals as discussed above. Note that in some embodiments, the transistors T11~T12 may also be removed and replaced by a short circuit path as shown in FIG. 2.

Figure 6:
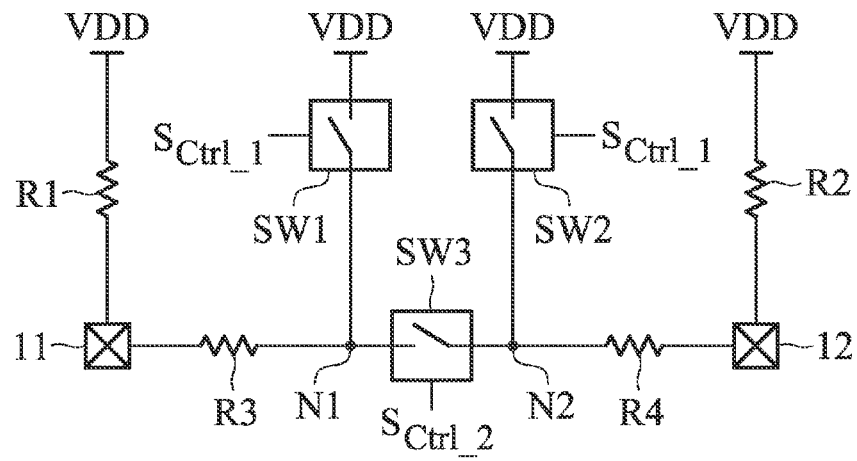
FIG. 6 shows an exemplary circuit diagram of a termination circuit according to a second embodiment of the invention.

FIG. 6 shows an exemplary circuit diagram of a termination circuit according to a second embodiment of the invention. The termination circuit 610 is similar to the termination circuit 210 as shown in FIG. 2, but different in that termination circuit 610 further comprises switches SW2~SW3. The switch SW2 is coupled between the supply voltage VDD and the node N2. The switch SW3 is coupled between the nodes N1 and N2.

An equivalent circuit of the termination circuit 610 may also be dynamically changed based on the format of the input data signals. According to an embodiment of the invention, when the first data signal and the second data signal are a pair of differential signals of a first format, for example, HDMI, the switches SW1 and SW2 are turned on in response to the control signal $S_{Ctrl\_1}$ and the switch SW3 is turned off in response to the control signal $S_{Ctrl\_2}$, such that the nodes N1 and N2 are disconnected from each other and respectively, and electrically, connected to the supply voltage VDD. In this manner, the resistive devices R1 and R3 are coupled in parallel between the supply voltage VDD and the pad 11 to contribute a first impedance, and the resistive devices R2 and R4 are coupled in parallel between the supply voltage VDD and the pad 12 to contribute a second impedance. In a preferred embodiment of the invention, the resistance of the resistive devices R1~R4 may be well designed such that the first impedance is equal to the second impedance. The resulting equivalent circuit of the termination circuit 610 when the switches SW1 and SW2 are turned on, the switch SW3 is turned off is the same as the one shown in FIG. 3.

On the other hand, when the first data signal and the second data signal are a pair of differential signals of a second format, for example, MHL, the switches SW1 and SW2 are turned off in response to the control signal $S_{Ctrl\_1}$ and the switch SW3 is turned on in response to the control signal $S_{Ctrl\_2}$, such that the nodes N1 and N2 are disconnected from the supply voltage VDD. In this manner, the resistive devices R3 and R4 are coupled in serial between the pads 11 and 12. The nodes N1 and/or N2 may become the common mode node such that the common mode signal (for example, the clock signal) carried in the first and second data signals may be extracted therefrom. The resulting equivalent circuit of the termination circuit 610 when the switches SW1 and SW2 are turned off, the switch SW3 is turned on is the same as the one shown in FIG. 4.

In some embodiments of the invention, the termination circuit 610 may further comprise a first additional switch coupled between the resistive device R1 and the supply voltage VDD and a second additional switch coupled between the resistive device R2 and the supply voltage VDD. The first and second additional switches may be generally turned on, and only turned off when required, for disconnecting the resistive devices R1 and R2 from the supply voltage VDD, and thereby the power consumption is saved. For example, when there is no other external data source providing data signal to the audio/video signal processing apparatus 100. In addition, in some embodiments of the invention, the switches as discussed above may also be replaced by a transistor, a BJT, or the likes.

Figure 7:
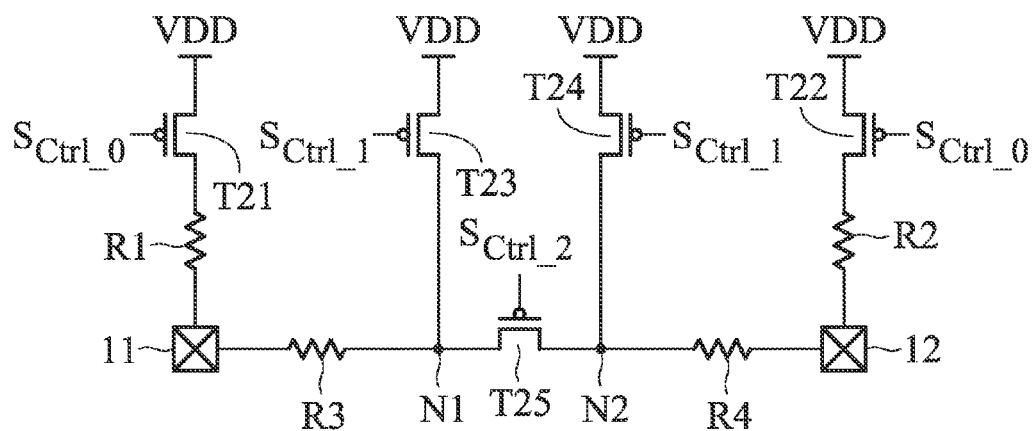
FIG. 7 shows another exemplary circuit diagram of a termination circuit according to the second embodiment of the invention.

FIG. 7 shows another exemplary circuit diagram of a termination circuit according to the second embodiment of the invention. The termination circuit 710 may comprise pads 11 and 12, resistive devices R1~R4 and transistors T21~T25. The transistors T21~T22 are turned on or off in response to the control signal $S_{Ctrl\_0}$, for selectively disconnecting the resistive devices R1 and R2 from the supply voltage VDD. For example, the transistors T21~T22 are turned off, causing the resistive devices R1 and R2 being disconnected from the supply voltage VDD, when the external data source 200 is removed and/or there is no other external data source providing data signals to the audio/video signal processing apparatus 100. The transistors T23 and T24 are turned on or off in response to the control signal $S_{Ctrl\_1}$ and the transistor T25 is turned on or off in response to the control signal $S_{Ctrl\_2}$ as discussed above, such that the resistive devices R3 and R4 are selectively connected to the supply voltage VDD. Therefore, an equivalent circuit of the termination circuit 710 may also be dynamically changed to the one shown in FIG. 3 or FIG. 4 based on the format of the input data signals as discussed above. Note that in some embodiments, the transistors T21~T22 may also be removed and replaced by a short circuit path as shown in FIG. 6.

Figure 8:
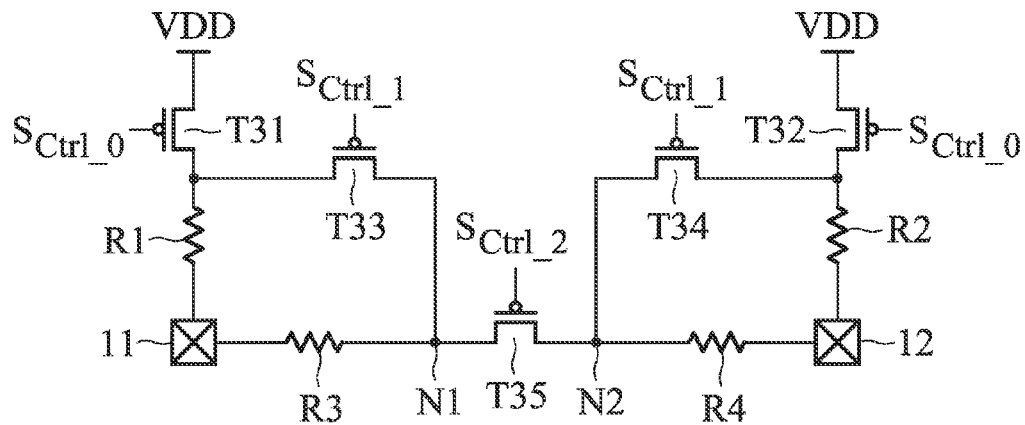
FIG. 8 shows yet another exemplary circuit diagram of a termination circuit according to the second embodiment of the invention.

FIG. 8 shows yet another exemplary circuit diagram of a termination circuit according to the second embodiment of the invention. The termination circuit 810 may comprise pads 11 and 12, resistive devices R1~R4 and transistors T31~T35. The transistors T31~T32 are turned on or off in response to the control signal $S_{Ctrl\_0}$, for selectively disconnecting the resistive devices R1 and R2 from the supply voltage VDD as discussed above. The transistors T33 and T34 are turned on or off in response to the control signal $S_{Ctrl\_1}$ and the transistor T35 is turned on or off in response to the control signal $S_{Ctrl\_2}$ as discussed above, such that the resistive devices R3 and R4 are selectively connected to the supply voltage VDD. The termination circuit 810 is similar to the termination circuit 710 shown in FIG. 7, but different in that one terminal of the transistor T33 is coupled to the transistor T31 and the resistive device R1, and one terminal of the transistor T34 is coupled to the transistor T32 and the resistive device R2. An equivalent circuit of the termination circuit 810 may also be dynamically changed to the one shown in FIG. 3 or FIG. 4 based on the format of the input data signals as discussed above. Note that in some embodiments, the transistors T31~T32 may also be removed and replaced by a short circuit path as shown in FIG. 6.

Figure 9:
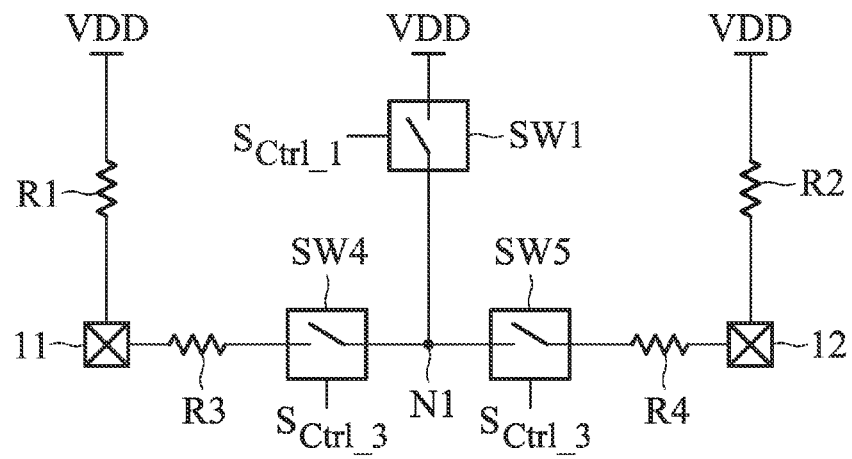
FIG. 9 shows an exemplary circuit diagram of a termination circuit according to a third embodiment of the invention.

FIG. 9 shows an exemplary circuit diagram of a termination circuit according to a third embodiment of the invention. The termination circuit 910 is similar to the termination circuit 210 as shown in FIG. 2, but different in that termination circuit 910 further comprises switches SW4~SW5. The switch SW4 is coupled between the resistive device R3 and the node N1. The switch SW5 is coupled between the resistive device R4 and the node N1.

An equivalent circuit of the termination circuit 910 may also be dynamically changed based on the format of the input data signals. According to an embodiment of the invention, when the first data signal and the second data signal are a pair of differential signals of a first format, for example, HDMI, the switch SW1 is turned on in response to the control signal $S_{Ctrl\_1}$ and the switch SW4 and SW5 are turned on in response to the control signal $S_{Ctrl\_3}$, such that the resistive devices R3 and R4 are electrically connected to the supply voltage VDD. In this manner, the resistive devices R1 and R3 are coupled in parallel between the supply voltage VDD and the pad 11 to contribute a first impedance, and the resistive devices R2 and R4 are coupled in parallel between the supply voltage VDD and the pad 12 to contribute a second impedance. In a preferred embodiment of the invention, the resistance of the resistive devices R1~R4 may be well designed such that the first impedance is equal to the second impedance. The resulting equivalent circuit of the termination circuit 610 when the switches SW1, SW4 and SW5 are turned on is the same as the one shown in FIG. 3.

On the other hand, when the first data signal and the second data signal are a pair of differential signals of a second format, for example, MHL, the switch SW1 is turned off in response to the control signal $S_{Ctrl\_1}$ and the switches SW4 and SW5 are turned on in response to the control signal $S_{Ctrl\_3}$, such that the node N1 is disconnected from the supply voltage VDD. In this manner, the resistive devices R3 and R4 are coupled in serial between the pads 11 and 12. The node N1 may become the common mode node such that the common mode signal (for example, the clock signal) carried in the first and second data signals may be extracted therefrom. The resulting equivalent circuit of the termination circuit 910 when the switches SW1 is turned off the switches SW4 and SW5 are turned on is the same as the one shown in FIG. 4.

In some embodiments of the invention, the termination circuit 910 may further comprise a first additional switch coupled between the resistive device R1 and the supply voltage VDD and a second additional switch coupled between the resistive device R2 and the supply voltage VDD. The first and second additional switches may be generally turned on, and only turned off when required, for disconnecting the resistive devices R1 and R2 from the supply voltage VDD, and thereby the power consumption is saved. For example, when there is no other external data source providing data signal to the audio/video signal processing apparatus 100. In addition, in some embodiments of the invention, the switches as discussed above may also be replaced by a transistor, a BJT, or the likes.

Figure 10:
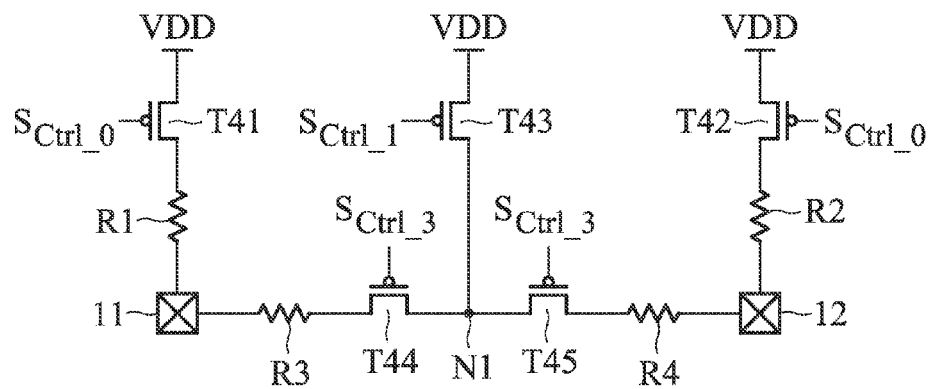
FIG. 10 shows another exemplary circuit diagram of a termination circuit according to the third embodiment of the invention.

FIG. 10 shows another exemplary circuit diagram of a termination circuit according to the third embodiment of the invention. The termination circuit 1010 may comprise pads 11 and 12, resistive devices R1~R4 and transistors T41~T45. The transistors T41~T42 are turned on or off in response to the control signal $S_{Ctrl\_0}$ as discussed above, such that the resistive devices R1 and R2 are disconnected from the supply voltage VDD when required. The transistor T43 is turned on or off in response to the control signal $S_{Ctrl\_1}$ and the transistors T44 and T45 are turned on or off in response to the control signal $S_{Ctrl\_3}$ as discussed above, such that the resistive devices R3 and R4 are selectively connected to the supply voltage VDD. Therefore, an equivalent circuit of the termination circuit 1010 may also be dynamically changed to the one shown in FIG. 3 or FIG. 4 based on the format of the input data signals as discussed above. Note that in some embodiments, the transistors T41~T42 may also be removed and replaced by a short circuit path as shown in FIG. 9.

Figure 11:
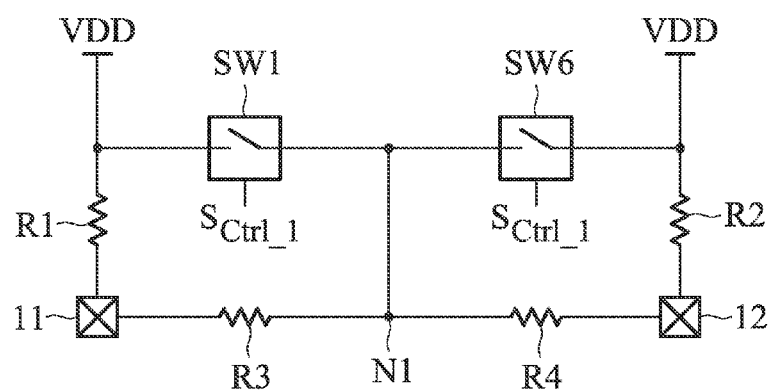
FIG. 11 shows an exemplary circuit diagram of a termination circuit according to a fourth embodiment of the invention.

FIG. 11 shows an exemplary circuit diagram of a termination circuit according to a fourth embodiment of the invention. The termination circuit 1110 is similar to the termination circuit 210 as shown in FIG. 2, but different in that termination circuit 1110 further comprises switch SW6 coupled between the supply voltage VDD and the node N1. In addition, the switch SW1 is further coupled to the resistive device R1 and the switch SW6 is further coupled to the resistive device R2.

An equivalent circuit of the termination circuit 1110 may also be dynamically changed based on the format of the input data signals. According to an embodiment of the invention, when the first data signal and the second data signal are a pair of differential signals of a first format, for example, HDMI, the switches SW1 and SW6 are turned on in response to the control signal $S_{Ctrl\_1}$, such that the resistive devices R3 and R4 are electrically connected to the supply voltage VDD. In this manner, the resistive devices R1 and R3 are coupled in parallel between the supply voltage VDD and the pad 11 to contribute a first impedance, and the resistive devices R2 and R4 are coupled in parallel between the supply voltage VDD and the pad 12 to contribute a second impedance. In a preferred embodiment of the invention, the resistance of the resistive devices R1~R4 may be well designed such that the first impedance is equal to the second impedance. The resulting equivalent circuit of the termination circuit 610 when the switches SW1 and SW6 are turned on is the same as the one shown in FIG. 3.

On the other hand, when the first data signal and the second data signal are a pair of differential signals of a second format, for example, MHL, the switches SW1 and SW6 are turned off in response to the control signal $S_{Ctrl\_1}$, such that the node N1 is disconnected from the supply voltage VDD. In this manner, the resistive devices R3 and R4 are coupled in serial between the pads 11 and 12. The node N1 may become the common mode node such that the common mode signal (for example, the clock signal) carried in the first and second data signals may be extracted therefrom. The resulting equivalent circuit of the termination circuit 1110 when the switches SW1 and SW6 are turned off is the same as the one shown in FIG. 4.

In some embodiments of the invention, the termination circuit 1110 may further comprise a first additional switch coupled between the resistive device R1 and the supply voltage VDD and a second additional switch coupled between the resistive device R2 and the supply voltage VDD. The first and second additional switches may be generally turned on, and only turned off when required, for disconnecting the resistive devices R1 and R2 from the supply voltage VDD, and thereby the power consumption is saved. For example, when there is no other external data source providing data signal to the audio/video signal processing apparatus 100. In addition, in some embodiments of the invention, the switches as discussed above may also be replaced by a transistor, a BJT, or the likes.

Figure 12:
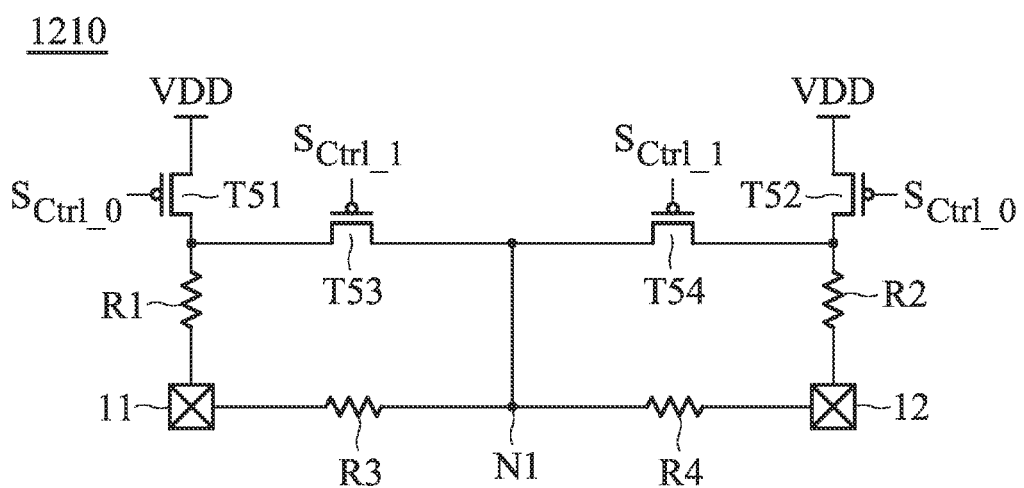
FIG. 12 shows another exemplary circuit diagram of a termination circuit according to the fourth embodiment of the invention.

FIG. 12 shows another exemplary circuit diagram of a termination circuit according to the fourth embodiment of the invention. The termination circuit 1210 may comprise pads 11 and 12, resistive devices R1~R4 and transistors T51~T54. The transistors T51~T52 are turned on or off in response to the control signal $S_{Ctrl\_0}$ as discussed above, such that the resistive devices R1 and R2 are disconnected from the supply voltage VDD when required. The transistors T53 and T54 are turned on or off in response to the control signal $S_{Ctrl\_1}$ as discussed above, such that the resistive devices R3 and R4 are selectively connected to the supply voltage VDD. Therefore, an equivalent circuit of the termination circuit 1210 may also be dynamically changed to the one shown in FIG. 3 or FIG. 4 based on the format of the input data signals as discussed above. Note that in some embodiments, the transistors T51~T52 may also be removed and replaced by a short circuit path as shown in FIG. 11.

Since the equivalent circuit of the termination circuits as illustrated above can all be dynamically changed to the one shown in FIG. 3 or FIG. 4 based on the detected format of the input data signals as discussed above, the proposed termination circuits are capable of being flexibly switched between different modes (e.g., a single-end termination mode and a differential termination mode) and receiving and processing data signals in different formats for performing impedance matching to reduce reflection loss. By way of example but not limitation, the resistance of the first and the second resistive devices R1 and R2 could be chosen as 60 ohm, and the resistance of the third and the fourth resistive devices R3 and R4 could be chosen as 300 ohm when the termination circuits 210-1210 are designed for supporting both the HDML and MHL modes.

While the invention has been described by way of example and in terms of preferred embodiment, it is to be understood that the invention is not limited thereto. Those who are skilled in this technology can still make various alterations and modifications without departing from the scope and spirit of this invention. Therefore, the scope of the present invention shall be defined and protected by the following claims and their equivalents.

What is claimed is:

1. A termination circuit, comprising:
   a first receiving terminal, receiving a first data signal;
   a second receiving terminal, receiving a second data signal;
   a first resistive device, coupled between a supply voltage and the first receiving terminal;
   a second resistive device, coupled between the supply voltage and the second receiving terminal;
   a third resistive device, coupled between the first receiving terminal and a first node;
   a fourth resistive device, coupled between the second receiving terminal and the first node; and
   a first switch, coupled between the supply voltage and the first node.

2. The termination circuit as claimed in claim 1, wherein the first switch is turned on or off in response to a first control signal, and when the first switch is turned on, the first resistive device and the third resistive device are coupled in parallel between the supply voltage and the first receiving terminal to contribute a first impedance and the second resistive device and the fourth resistive device are coupled in parallel between the supply voltage and the second receiving terminal to contribute a second impedance, and wherein the first impedance is substantially equal to the second impedance.

3. The termination circuit as claimed in claim 1, wherein when the first data signal and the second data signal are a pair of differential signals of a first format, the first switch is turned on, and when the first data signal and the second data signal are a pair of differential signals of a second format, the first switch is turned off.

4. The termination circuit as claimed in claim 1, further comprising:
   a second switch, coupled between the supply voltage and a second node; and
   a third switch, coupled between the first node and the second node.

5. The termination circuit as claimed in claim 4, wherein the first switch and the second switch are turned on or off in response to a first control signal, and the third switch is turned on or off in response to a second control signal, and when the first switch and the second switch are turned on, the third switch is turned off, the first resistive device and the third resistive device are coupled in parallel between the supply voltage and the first receiving terminal to contribute a first impedance, and the second resistive device and the fourth resistive device are coupled in parallel between the supply voltage and the second receiving terminal to contribute a second impedance, and wherein the first impedance is substantially equal to the second impedance.

6. The termination circuit as claimed in claim 5, wherein when the first data signal and the second data signal are a pair of differential signals of a first format, the first switch and the second switch are turned on and the third switch is turned off, and when the first data signal and the second data signal are a pair of differential signals of a second format, the first switch and the second switch are turned off and the third switch is turned on.

7. The termination circuit as claimed in claim 1, further comprising:
   a second switch, coupled between the first receiving terminal and the first node; and
   a third switch, coupled between the second receiving terminal and the first node.

8. The termination circuit as claimed in claim 7, wherein when the first data signal and the second data signal are a pair of differential signals of a first format, the first switch, the second switch and the third switch are turned on such that the first resistive device and the third resistive device are coupled in parallel between the supply voltage and the first receiving terminal to contribute a first impedance and the second resistive device and the fourth resistive device are coupled in parallel between the supply voltage and the second receiving terminal to contribute a second impedance, wherein the first impedance is equal to the second impedance, and when the first data signal and the second data signal are a pair of differential signals of a second format, the first switch is turned off and the second switch and the third switch are turned on.

9. The termination circuit as claimed in claim 1, further comprising:
   a second switch, coupled between the supply voltage and the first node,
   wherein the first switch is further coupled to the first resistive device and the second switch is further coupled to the second resistive device.

10. The termination circuit as claimed in claim 9, wherein when the first data signal and the second data signal are a pair of differential signals of a first format, the first switch and the second switch are turned on such that the first resistive device and the third resistive device are coupled in parallel between the supply voltage and the first receiving terminal to contribute a first impedance and the second resistive device and the fourth resistive device are coupled in parallel between the supply voltage and the second receiving terminal to contribute a second impedance, wherein the first impedance is equal to the second impedance, and when the first data signal and the second data signal are a pair of differential signals of a second format, the first switch and the second switch are turned off.

11. The termination circuit as claimed in claim 1, wherein the first switch is turned on or off for selectively connecting at least one of the third resistive device and the fourth resistive device to the supply voltage.

12. A termination circuit, comprising:
a first receiving terminal, receiving a first data signal;
a second receiving terminal, receiving a second data signal;
a first resistive device, coupled between a supply voltage and the first receiving terminal;
a second resistive device, coupled between the supply voltage and the second receiving terminal;
a third resistive device; and
a fourth resistive device;
wherein when the first and second data signals are a pair of differential signals of a first format, the third resistive device is configured to be coupled between the supply voltage and the first receiving terminal, and the fourth resistive device is configured to be coupled between the supply voltage and the second receiving terminal, and
wherein when the first and second data signals are a pair of differential signals of a second format, the third resistive device and the fourth resistive device are configured to be coupled in series between the first receiving terminal and the second receiving terminal.

13. The termination circuit as claimed in claim 11, further comprising a first switch coupled to the third and fourth resistance devices and the supply voltage, wherein when the first data signal and the second data signal are a pair of differential signals of the first format, the first switch causes the first resistive device and the third resistive device to be coupled in parallel between the supply voltage and the first receiving terminal to contribute a first impedance and causes the second resistive device and the fourth resistive device to be coupled in parallel between the supply voltage and the second receiving terminal to contribute a second impedance, and when the first data signal and the second data signal are a pair of differential signals of the second format, the first switch causes the third and the fourth resistance devices to be coupled in series between the first receiving terminal and the second receiving terminal.

14. The termination circuit as claimed in claim 13, further comprising:
a second switch, coupled between the supply voltage and the first resistance device; and
a third switch, coupled between the supply voltage and the second resistance device.

15. The termination circuit as claimed in claim 13, wherein when there is no first data signal received by the first receiving terminal, the second switch is turned off, and when there is no second data signal received by the second receiving terminal, the third switch is turned off.

16. A termination circuit, comprising:
a first receiving terminal, receiving a first data signal;
a second receiving terminal, receiving a second data signal;
a first 60 ohm resistor, coupled between a supply voltage and the first receiving terminal;
a second 60 ohm resistor, coupled between the supply voltage and the second receiving terminal;
a first 300 ohm resistor, coupled between the first receiving terminal and a first node;
a second 300 ohm resistor, coupled between the second receiving terminal and the first node; and
a switch, coupled between the supply voltage and the first node;
wherein the switch is turned on when the first data signal and the second data signal are HDMI signals, and the switch is turned off when the first data signal and the second data signal are MHL signals.

* * * * *